(12) United States Patent
Kim et al.

(10) Patent No.: US 8,648,379 B2
(45) Date of Patent: Feb. 11, 2014

(54) LED LAMP ASSEMBLY

(71) Applicant: LEDLitek Co., Ltd., Sejong-si (KR)

(72) Inventors: Eun Sung Kim, Yeonggwang-gun (KR); Hee Yong Choi, Cheongwon-gun (KR); Hwang Ryong Kim, Gwangju (KR)

(73) Assignee: Ledlitek Co., Ltd., Sejong-Si (KR)

( * ) Notice: Subject to any disclaimer, the term of this patent is extended or adjusted under 35 U.S.C. 154(b) by 0 days.

(21) Appl. No.: 13/760,209

(22) Filed: Feb. 6, 2013

(65) Prior Publication Data

US 2013/0200410 A1    Aug. 8, 2013

(30) Foreign Application Priority Data

Feb. 7, 2012    (KR) .................. 10-2012-0012508

(51) Int. Cl.
*H01L 21/02*    (2006.01)

(52) U.S. Cl.
USPC .. 257/98; 257/99; 257/E33.072; 257/E33.075

(58) Field of Classification Search
USPC ............... 257/98, 99, E25.02, 33.066–33.076
See application file for complete search history.

(56) References Cited

U.S. PATENT DOCUMENTS

| | | | |
|---|---|---|---|
| 6,550,953 B1 * | 4/2003 | Takahashi et al. | 315/56 |
| 8,227,968 B2 * | 7/2012 | Kaandorp et al. | 313/114 |
| 2008/0019142 A1 * | 1/2008 | Rapeanu et al. | 362/555 |
| 2008/0174224 A1 * | 7/2008 | Liao et al. | 313/318.01 |
| 2008/0309257 A1 * | 12/2008 | Hickey | 315/307 |
| 2010/0079984 A1 * | 4/2010 | Liu | 362/183 |
| 2012/0075833 A1 * | 3/2012 | Le et al. | 362/84 |
| 2012/0224352 A1 * | 9/2012 | Yagi et al. | 362/84 |
| 2012/0320591 A1 * | 12/2012 | Liao et al. | 362/249.02 |
| 2013/0043781 A1 * | 2/2013 | Wang | 313/46 |
| 2013/0062641 A1 * | 3/2013 | Lin et al. | 257/98 |
| 2013/0070454 A1 * | 3/2013 | Zeng et al. | 362/235 |
| 2013/0082600 A1 * | 4/2013 | Ter-Hovhanissian | 315/112 |
| 2013/0088854 A1 * | 4/2013 | Chiu | 362/95 |
| 2013/0208474 A1 * | 8/2013 | Chuang | 362/249.02 |
| 2013/0271990 A1 * | 10/2013 | Hussell et al. | 362/249.02 |

* cited by examiner

*Primary Examiner* — Michael Lebentritt (74) *Attorney, Agent, or Firm* — Lexyoume IP Meister, PLLC.

(57) ABSTRACT

Provided is a light emitting diode (LED) lamp assembly having an increased light incidence angle by fixing unit LED lamps fixed on a substrate at various angles. The LED lamp assembly includes a substrate having a socket portion and an LED mounting portion, first unit LED modules installed on both surfaces of the substrate and irradiating light onto the both surfaces of the substrate in a frontward direction, and second unit LED modules irradiating light onto the both surface of the substrate in directions other than the frontward direction. In the LED lamp assembly, since first and second unit LED modules having light irradiation units formed at different positions are installed on both surfaces of a single substrate, light can be irradiated in a radial direction.

6 Claims, 11 Drawing Sheets

LED LAMP ASSEMBLY

CROSS-REFERENCE TO RELATED APPLICATION

This application claims priority from Korean Patent Application No. 10-2012-0012508 filed on Feb. 7, 2012 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a lamp assembly, and more particularly to a light emitting diode (LED) lamp assembly having an increased light incidence angle by fixing unit LED lamps fixed on a substrate at various angles.

2. Description of the Related Art

In general, a variety of vehicular lamps used for automobiles may demonstrate various colors and light on-and-off states to notify others of an automobile state and may include rear-view lamps, tail lamps, park lamps, clearance lamps, direction indicator lamps, hazard warning lamps, brake lamps, vehicle indicator lamps, and so on. Filament-based lamps or LED lamps are generally used as the vehicular lamps. In view of filament property, the filament based lamp is turned on and off by heating. Thus, a cycle life of the filament based lamp is relatively short. In addition, when power is applied, a predetermined time is required to achieve temperature radiation, lowering responsiveness.

By contrast, while the LED lamp is superb in responsiveness, it has directionality, making it difficult to extend an angle of light irradiation.

Korean Patent Application No. 10-2011-0024773 discloses an LED lighting module and a lighting lamp using the same. In the disclosed LED module configuration, a plurality of LED devices of a vertical projection type and a side projection type, a light diffusing cover having one or more protrusion type wings formed on its left and right sides, and a thin heat dissipation plates are integrally formed.

Korean Patent Registration No. 0965558 discloses an LED bulb. The disclosed LED bulb includes: an LED for emitting light; a substrate having a wiring pattern for supplying power to the LED, the LED fixed to its upper side; a substrate mounting unit shaped of a polyhedron and having polygonal surfaces, excluding one of the surfaces, fixed to a lower side of the substrate; and a heat sink formed to have a planar top surface and having an upwardly protruding coupling unit formed in the center of its top surface and attached to a surface that is not attached to the substrate, among the polygonal surfaces of the polyhedron, the heat sink discharging the heat generated from the LED and the substrate to the outside.

The conventional LED lamp is configured such that a substrate having an LED installed thereon is formed in a cylindrical or polyhedral shape, thereby allowing the LED to irradiate light at various angles. In the conventional LED lamp, however, a plurality of substrates need to be assembled, yielding the complicated LED lamp structure and requiring increased manufacturing man-hour. In particular, since a light irradiation direction of the LED mounted on the substrate is determined by an angle of the substrate, it is not easy to determine the light irradiation direction.

Japanese registered utility model No. 3089136 discloses an LED bulb for an automobile capable of emitting light at various angles.

SUMMARY

The present invention provides an LED lamp assembly, which can irradiate light at various angles and can obviate the need for adjustment of a substrate mounting angle to adjust a light irradiation angle, thereby reducing the manufacturing cost and improving the manufacturability.

The present invention also provides a LED lamp assembly, which can easily assemble/disassemble a socket portion provided on a substrate to/from a socket for supplying power, and can increase a coupling force between the socket portion and the socket.

These and other objects of the present invention will be described in or be apparent from the following description of the preferred embodiments.

According to an aspect of the present invention, there is provided a light emitting diode (LED) lamp assembly including a substrate having a socket portion and an LED mounting portion, first unit LED modules installed on both surfaces of the substrate and irradiating light onto the both surfaces of the substrate in a frontward direction, and second unit LED modules irradiating light onto the both surface of the substrate in directions other than the frontward direction.

The second unit LED modules may include light irradiation portions formed on side surfaces of an LED module main body having a mounting portion mounted on the substrate.

A second light irradiation portion formed on a second main body of the second unit LED module and a first light irradiation portion formed on a first main body of the first unit LED module may be formed at different positions.

Electrode terminals each having an elastically deformed part that is outwardly deformed may be formed on both side surfaces coupled to the socket portion.

A volume forming member having a locking protrusion for preventing deviation when coupled to the socket may be installed on both surfaces of the socket portion.

The LED mounting portion of the substrate may include a first development portion connected to the socket portion and bent to form an outer circumferential portion of the LED lamp and a second development portion connected to the edge of an upper portion of the first development portion.

As described above, since the LED lamp assembly irradiates light in a radial direction using first unit LED modules, it can be replaced by the conventional LED lamp for an automotive vehicle. In addition, since first and second unit LED modules are simply arranged and installed, the manufacturability can be improved and mass production can be easily achieved.

In particular, when first and second unit LED modules are surface-mounted on a substrate, light irradiation directions, that is, orientation angles, of the first and second unit LED modules can be easily diversified.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

The present invention is directed to an LED lamp capable of irradiating light at various angles of its outer circumferential surface using a plurality of LED modules, and various embodiments thereof are shown in FIGS. 1 to 7.

Referring to FIGS. 1 to 7, the LED lamp 10 according to the present invention includes a substrate 13 having an LED mounting portion 11 and a socket portion 12, first unit LED modules 20 installed on both surfaces or one surface of the LED mounting portion 11 of the substrate 13 for irradiating light in a frontward direction of the both surfaces or one surface of the LED mounting portion 11, and second unit LED modules 30 for irradiating light in directions other than the frontward direction.

The substrate 13 is shaped of a plate. Although not clearly shown, signal patterns having a pad layer are formed at both sides of the substrate 13 to surface-mount the first and second unit LED modules 20 and 30. The LED mounting portion 11 of the substrate 13 preferably has a larger area than the socket portion 12 and may be shaped of a circular or polygonal plate according to the shape of lamp. The substrate 13 may include a single body.

The first unit LED module 20 includes a first main body 22 having a first surface mounting portion 21 surface-mounted on the LED mounting portion 11 of the substrate 13, and a first light irradiation portion 23 formed on a top surface of the first main body 22 corresponding to the first surface mounting portion 21. The first light irradiation portion 23 has an LED 23a installed thereon. An optical lens for focusing or diffusing light may be installed on a side of the first light irradiation portion 23 corresponding to the LED 23a.

The second unit LED module 30 includes a second main body 32 having a second surface mounting portion 31 surface-mounted on the LED mounting portion 11 of the substrate 13, and a second light irradiation portion 33 formed on a side surface of the second main body 32.

The second light irradiation portion 33 is substantially the same as the first light irradiation portion 23.

Figure 1:
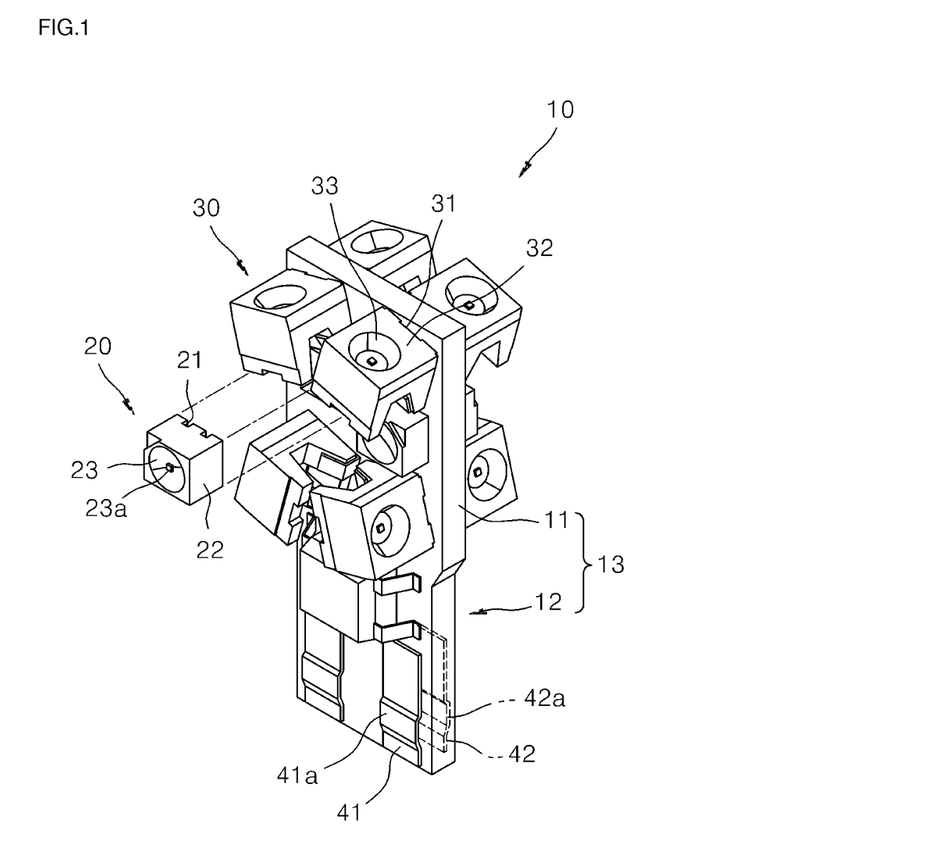
FIG. 1 is a perspective view of an LED lamp assembly according to an embodiment of the present invention.
Figure 2:
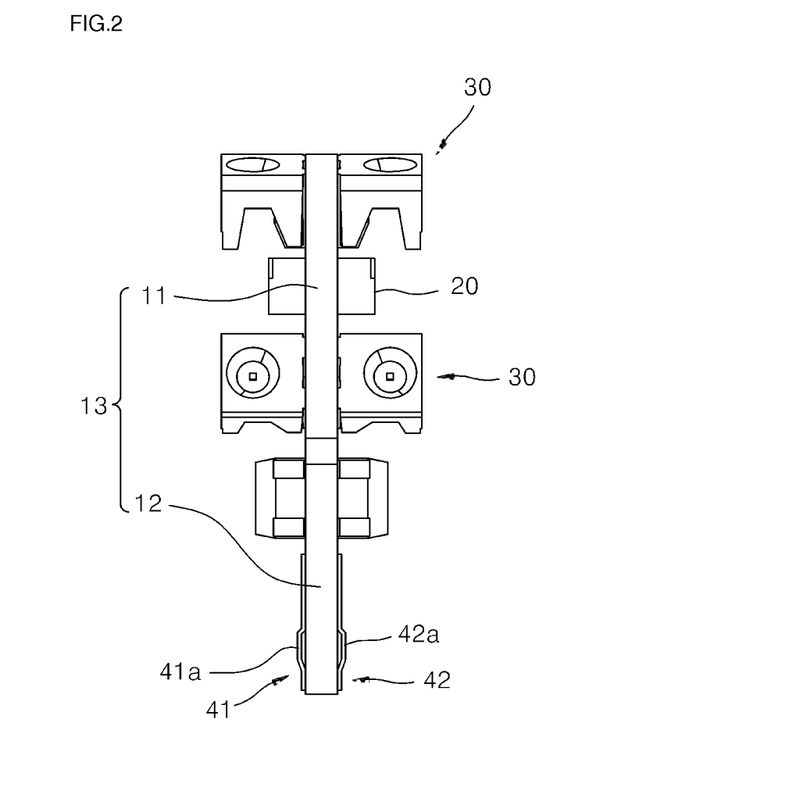
FIG. 2 is a side view of the LED lamp assembly shown in FIG. 1.
Figure 3:
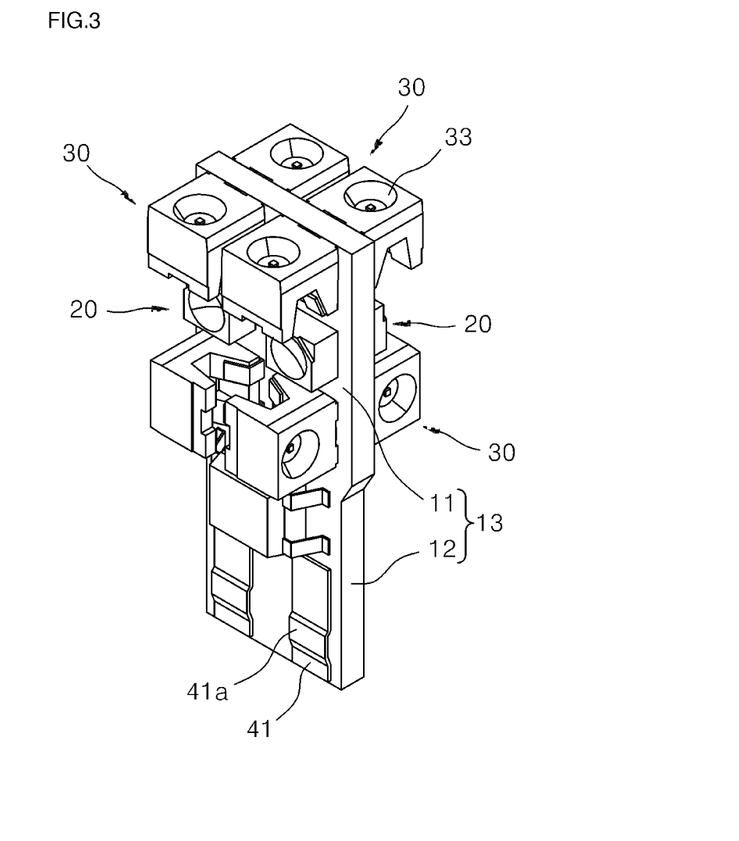
FIG. 3 is a perspective view of an LED lamp assembly according to another embodiment of the present invention.
Figure 4:
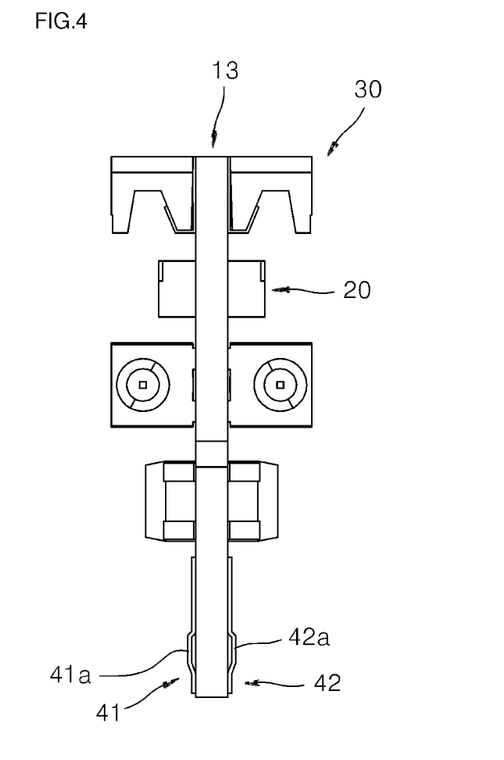
FIG. 4 is a side view of the LED lamp assembly shown in FIG. 3.

Since the second unit LED module 30 has the second light irradiation portion 33 formed at its side surface, it can irradiate light at various angles, as shown in FIGS. 1 to 5, according to the installed direction. That is to say, orientation angles of the second unit LED module 30 can be diversified, thereby securing light irradiation areas of various angles. As shown in FIGS. 1 and 2, when the LED mounting portion 11 is shaped of a circular plate, the second unit LED modules 30 may be arranged at both edges of the LED mounting portion 11 and the first unit LED modules 20 or combinations of the first and second unit LED modules 20 and 30 may be arranged inside the LED mounting portion 11. As shown in FIGS. 3 and 4, second unit LED modules 30 each having a second light irradiation portion 33 are installed on side surfaces of upper and lower sides of the LED mounting portion 11 of the substrate 13, and first unit LED modules 20 may be installed between the upper and lower second unit LED modules 30. In particular, the lower second unit LED modules 30 are preferably installed to face upward, and are mounted at different irradiation angles from the first unit LED modules 20.

Figure 5:
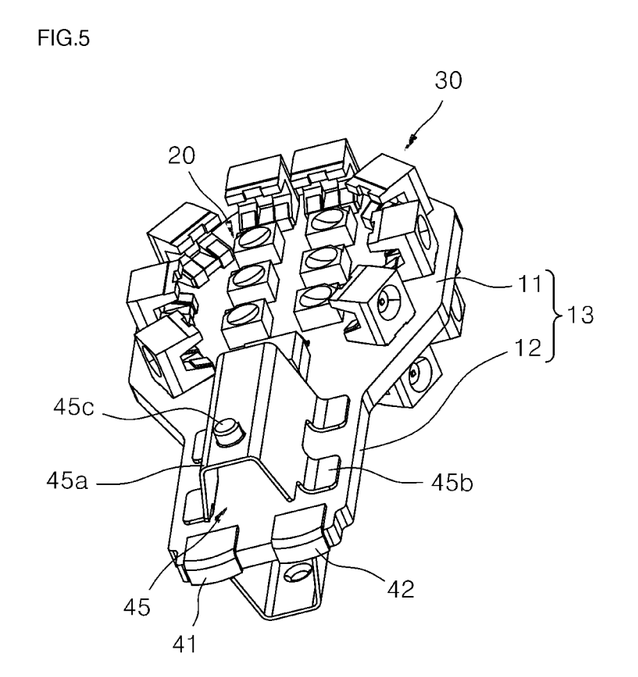
FIG. 5 is a perspective view of an LED lamp assembly according to still another embodiment of the present invention.

As shown in FIG. 5, when the LED mounting portion 11 is shaped of a circular plate or a square or polygonal plate, the second unit LED modules 30 may be installed along the edge of the LED mounting portion 11 to allow light to be irradiated outwardly.

Meanwhile, as shown in FIGS. 1 and 3, the socket portion 12 of the substrate 13 for supplying power to the first and second unit LED modules 20 and 30 installed on the LED mounting portion 11 have electrode terminals 41 and 42 formed on both surfaces of the socket portion 12. Elastically deformed parts 41a and 42a that are bent and protrude are formed in the electrode terminals 41 and 42, respectively. The electrode terminals 41 and 42 are surface-mounted on pads of the signal patterns (not shown) provided on the substrate 13. The present invention does not limit structures of the electrode terminals 41 and 42 to those illustrated herein, but any structures can be employed as long as they are capable of supplying power to the signal lines formed on the substrate 13. That is to say, electrode terminals 41 and 42 may be installed on a bottom surface of the socket portion 12.

Figure 6:
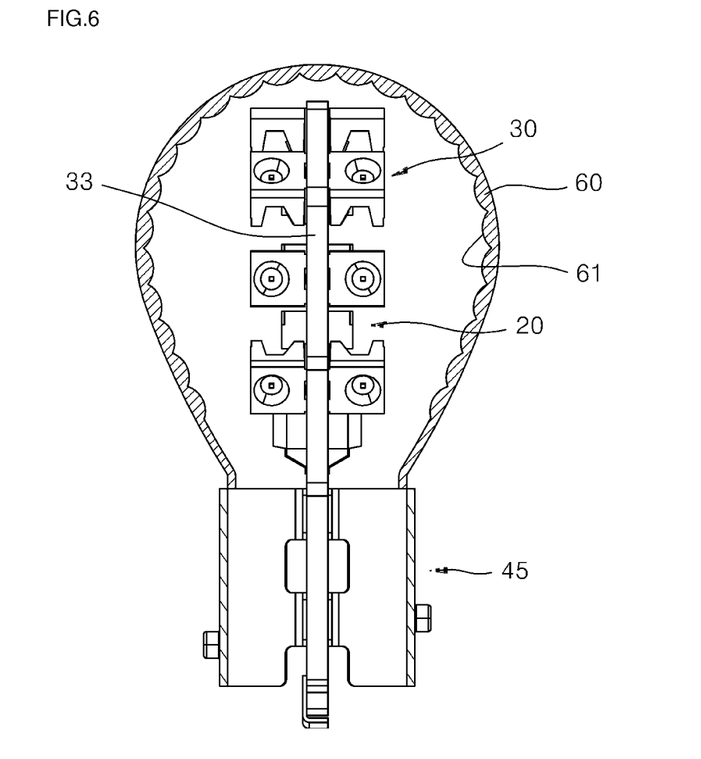
FIG. 6 is a partially cut-away side view of an LED lamp assembly according to still another embodiment of the present invention.

As shown in FIGS. 5 and 6, the socket portion 12 has volume forming members 45 installed on both surfaces of the socket portion 12 so as to be coupled to and used with the existing socket. Each of the volume forming members 45 has a semi-circular or channel-shaped body 45a to provide a rod shape on an outer circumferential surface of the socket portion 12. A support portion 45b fixed to the socket portion 12 is provided at a lengthwise edge of the volume forming member 45. A locking protrusion 45c coupled to a coupling groove of the socket of an automobile for preventing deviation when coupled to the socket is installed on the outer circumferential surface of the volume forming member 45.

The present invention does not limit the structure of the socket portion to that illustrated herein, but any structure can be employed as long as it can be coupled to the socket for supplying power.

Figure 9:
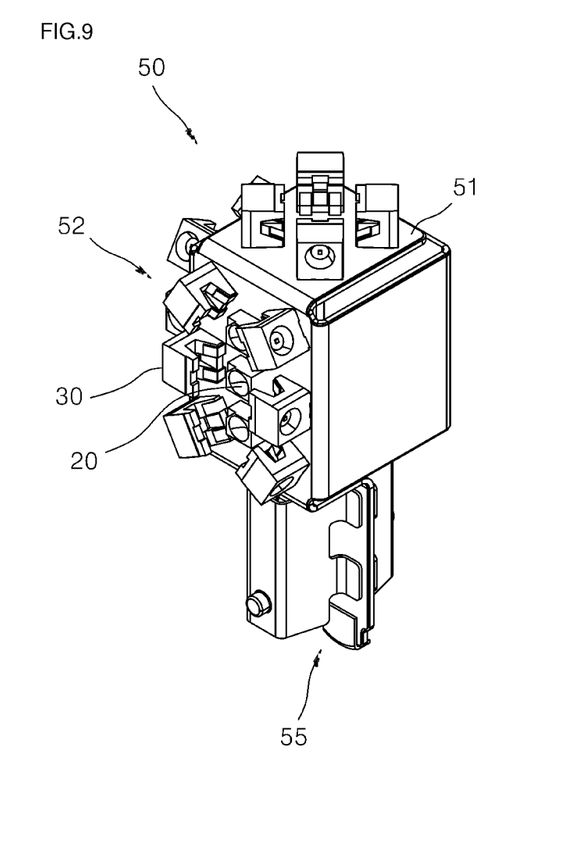
FIG. 9 is a perspective view of an LED lamp assembly according to still another embodiment of the present invention.
Figure 10:
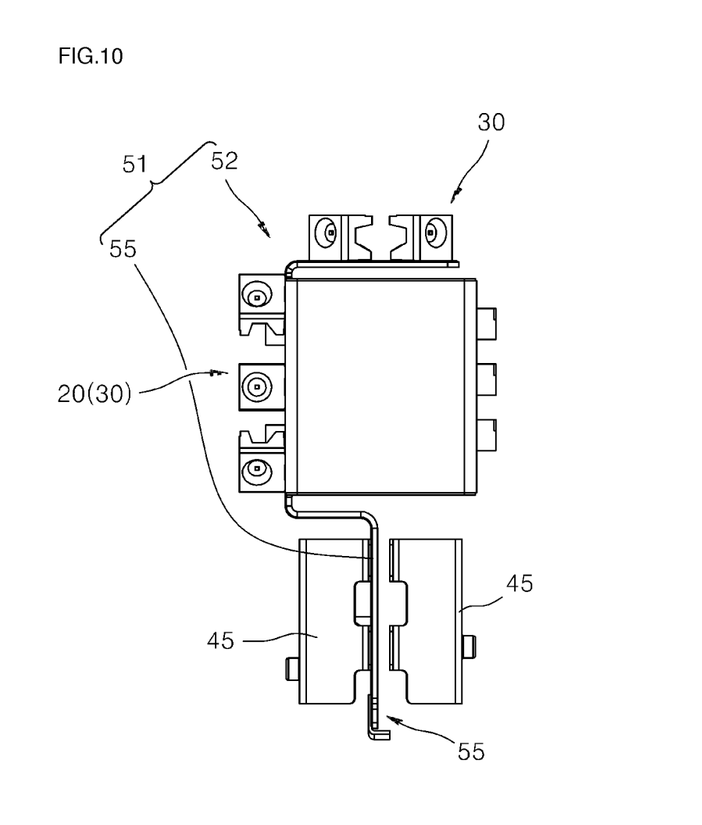
FIG. 10 is a cross-sectional view of the LED lamp assembly shown in FIG. 9.
Figure 11:
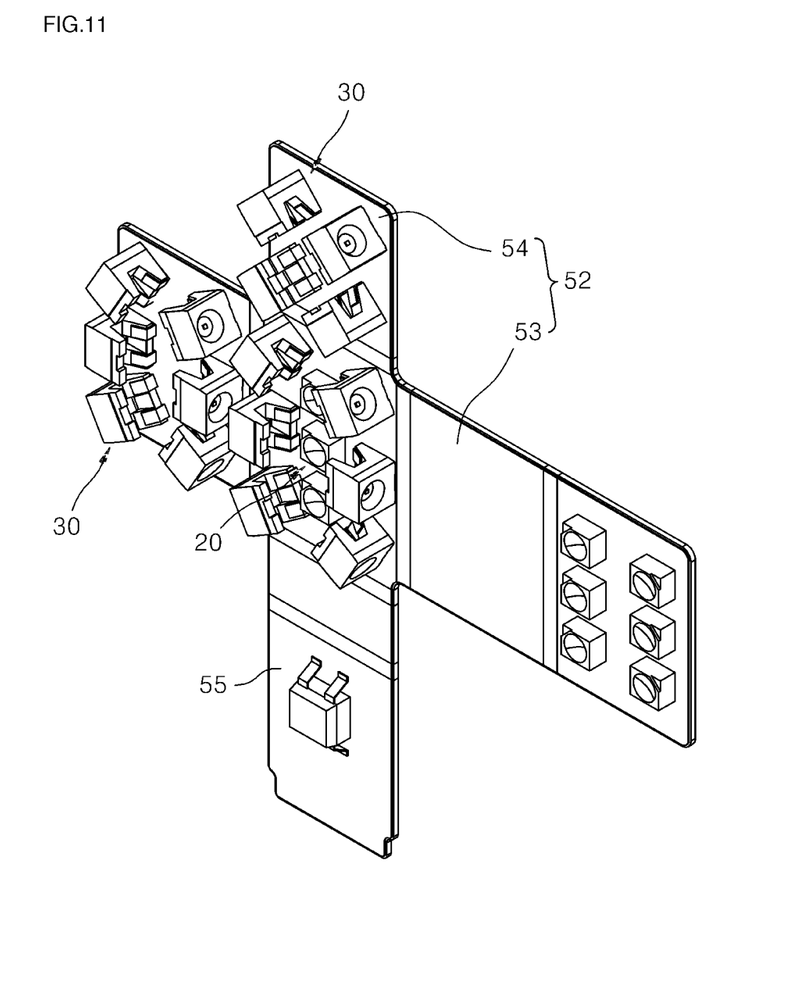
FIG. 11 is a development view of the LED lamp assembly shown in FIG. 9.

FIGS. 9 to 11 illustrate some other embodiments of the lamp assembly according to the present invention.

Referring to FIGS. 9 to 11, the lamp assembly 50 includes an LED mounting portion 52 and a single substrate 51 on which a socket portion 55 can be bent. The substrate 51 may be formed to maintain its shape by attaching a metal plate member to a metal board or a flexible board or by forming a metal signal line on a flexible circuit board to a predetermined thickness in a predetermined pattern.

As shown in FIG. 11, the LED mounting portion 52 of the substrate 51 includes a first development portion 53 forming the outer circumferential portion of the lamp assembly 50 and a second development portion 54 forming a top portion of the lamp assembly 50. The socket portion 55 downwardly extends from a lower edge of the first development portion 53, and the second development portion 54 extends from an upper edge of the first development portion 53 corresponding to the socket portion 55.

Preferably, the first development portion 53 is developed to form a tetrahedron, but aspects of the present invention are not limited thereto. As shown in FIG. 9, the outer circumferential surface of the lamp assembly 50 may be bent to form a rectangular surface thereon, but aspects of the present invention are not limited thereto. Rather, the outer circumferential surface of the lamp assembly 50 may also be bent to form a circular or polygonal surface thereon. If the first development portion 53 has a circular or polygonal surface, the second development portion has a shape corresponding to that of the first development portion 53. That is to say, if the outer circumferential surface of the lamp assembly 50, formed by the first development portion 53, has a circular shape, the second development portion may also have a circular shape.

As shown in FIG. 10, the socket portion 55 is inwardly bent from a lower edge of the first development portion 53 and then downwardly bent to be positioned on the vertical center axis of the lamp assembly. However, the present invention does not limit the shape of the socket portion 55 to that illustrated herein, but the shape of the socket portion 55 may vary according to the characteristics of the lamp assembly 50. In addition, electrode terminals each having an elastically deformed part may be installed in the socket portion 55, and volume forming members 45 may be installed at both sides of the socket portion 55. Various components for implementing the lamp assembly may be mounted on the socket portion 55 or inner surfaces of the first and second development portions 53 and 54, that is, inner surfaces corresponding to surfaces on which first and second unit LED modules are installed. However, according to necessity, the components may be installed on outer circumferential surfaces of the first and second development portions 53 and 54.

Meanwhile, as described above, the first and second unit LED modules 20 and 30 are installed in the first and second development portions 53 and 54, forming the LED mounting portion 52. Since the first and second unit LED modules 20 and 30 have substantially the same structures as those of the previous embodiment, and repeated descriptions will not be made.

Figure 7:
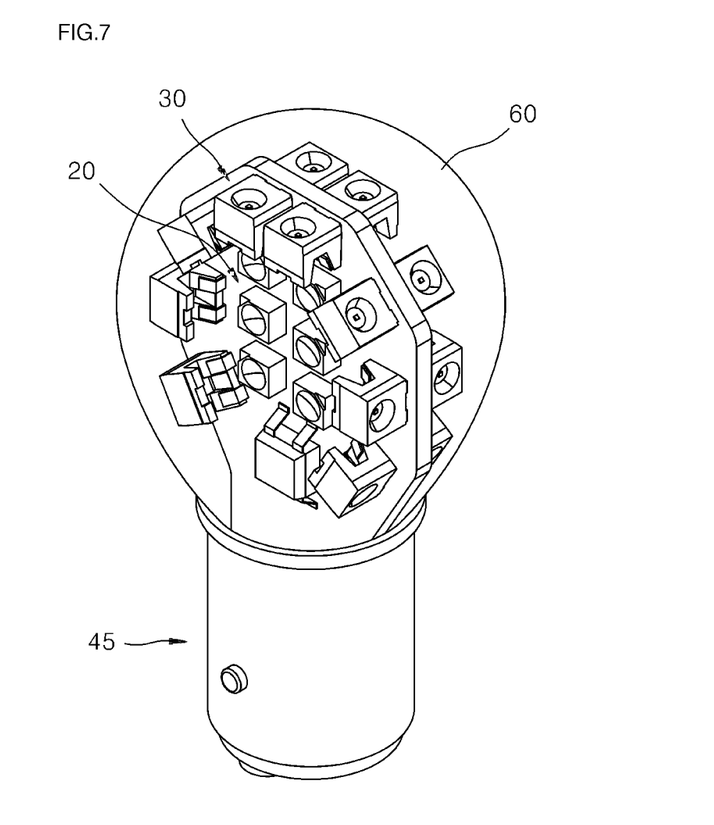
FIG. 7 is a perspective view of an LED lamp assembly according to still another embodiment of the present invention.
Figure 8:
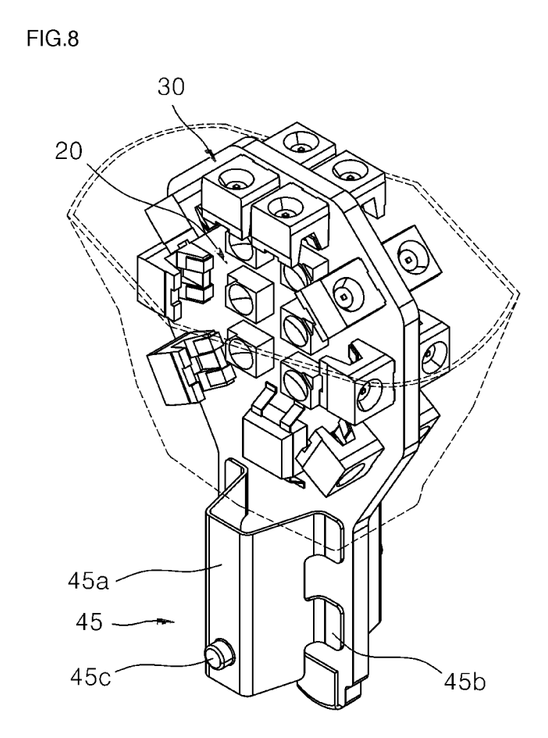
FIG. 8 is a perspective view of an LED lamp assembly according to still another embodiment of the present invention.

As shown in FIGS. 6 to 8, the above-described lamp assembly may include a lamp cover (bulb) 60 made of a transparent or translucent material to protect the first and second unit LED modules 20 and 30.

A diffusion pattern 61 for focusing or diffusing light may be formed on the lamp cover 60. The diffusion pattern 61 may include polygonal protrusions formed on its inner surface or outer surface. In particular, a focusing lens unit for focusing light may be formed on the inner circumferential surface of the lamp cover 60 corresponding to a boundary between the first unit LED module 20 and the second unit LED module 30, and a divergent lens unit for diffusing the focused light may be formed on the outer circumferential surface of the lamp cover 60. The focusing lens unit and the divergent lens unit can remove non-uniformity in the light amount of the boundary between the first unit LED module 20 and the second unit LED module 30. The lamp cover 60 may be formed of a single body or multiple separate members to be assembled together.

The aforementioned LED lamp according to the present invention operates as follows.

In order to illuminate a surrounding area using the LED lamp 10 according to the present invention, the socket portion 12 of the LED lamp 10 is coupled to a socket. Here, as shown in FIGS. 1 and 5, when the socket portion 12 has a volume forming member 45, the shape of the outer circumferential surface of the socket portion 12 is roughly cylindrical, like in a socket portion of the conventional lamp, so that the substrate is coupled to and used with the conventional socket.

In addition, as shown in FIGS. 1 and 3, when the socket portion 12 is shaped of a plate, the plate-shaped socket portion 12 is coupled to the socket having a coupling unit into which the socket portion is fitted. Since the electrode terminals 41 and 42 having elastically deformed parts 41a and 42a are provided in the socket portion 12, it is possible to prevent the socket portion 12 from being easily separated from the socket (not shown).

If the current is supplied to the electrode terminals 41 and 42 through the socket, the first and second unit LED modules 20 and 30 connected to the electrode terminals 41 and 42 by signal lines emit light.

In the above-described operation, the first unit LED modules 20 installed on the LED mounting portion 11 of the substrate 13 irradiate light in a direction normal to both surfaces of the first unit LED modules 20. Each of the second unit LED modules 30 installed at edges or upper and lower sides of the substrate 13 has a second light irradiation portion 33 formed on a side surface of the second main body 32, and irradiates light toward the peripheral portions of the substrate 13, that is, in a direction parallel to a surface of the substrate 13. Therefore, the light irradiated from the first and second unit LED modules 20 and 30 is irradiated to the peripheral portions of the LED mounting portion 11.

In the LED lamp 10, each of the first unit LED modules 20 having a light irradiation unit is formed on its top surface corresponding to the first surface mounting portion 21, and the second light irradiation portion 33 is formed on the side surface of the second main body 32 to be perpendicular to the second surface mounting portion 31. Therefore, even when the substrate is shaped of a plate, light can be irradiated in a radial direction.

Meanwhile, since the LED lamp 10 is configured by attaching the first and second unit LED modules 20 and 30 to both surfaces of a single substrate, it has a simplified configuration, compared to the conventional LED module in which a plurality of substrates are employed in assembling the LED module. In particular, since the LED mounting portion 52 has first and second development portions 53 and 54, a surface area of the LED mounting portion 52 can be increased. In addition, the LED mounting portion 52 can be implemented in various shapes according to bending patterns of the first and second development portions 53 and 54.

Further, since a single substrate is used, the manufacturing cost can be reduced, and the manufacturability of the LED lamp can be improved, while increasing a degree of freedom in designing the LED lamp.

Since the lamp cover 60 is installed in the LED lamp assembly according to the present invention, it can protect the first and second unit LED modules and the circuit board. In addition, the diffusion pattern 61 having polygonal protrusions for diffusing light is provided on the inner circumferential surface of the lamp cover 60, the light can be uniformly irradiated.

The LED lamp assembly according to the present invention can be widely applied to an automotive vehicular lamp, or a lamp for illuminating a housing space.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A light emitting diode (LED) lamp assembly comprising:
 a substrate having a socket portion and an LED mounting portion;
 first unit LED modules installed on both surfaces of the substrate and irradiating light onto the both surfaces of the substrate in a frontward direction; and
 second unit LED modules irradiating light onto the both surface of the substrate in directions other than the frontward direction.

2. The LED lamp assembly of claim 1, wherein the second unit LED modules include light irradiation portions formed on side surfaces of an LED module main body having a mounting portion mounted on the substrate.

3. The LED lamp assembly of claim 1, wherein a second light irradiation portion formed on a second main body of the second unit LED module and a first light irradiation portion formed on a first main body of the first unit LED module are formed at different positions.

4. The LED lamp assembly of claim 1, wherein electrode terminals each having an elastically deformed part that is outwardly deformed are formed on both side surfaces coupled to the socket portion.

5. The LED lamp assembly of claim 4, wherein a volume forming member having a locking protrusion for preventing deviation when coupled to the socket is installed on both surfaces of the socket portion.

6. The LED lamp assembly of claim 1, wherein the LED mounting portion of the substrate includes a first development portion connected to the socket portion and bent to form an outer circumferential portion of the LED lamp and a second development portion connected to the edge of an upper portion of the first development portion.

* * * * *